(12) United States Patent
Lee et al.

(10) Patent No.: US 12,205,802 B2
(45) Date of Patent: Jan. 21, 2025

(54) SUBSTRATE PROCESSING APPARATUS AND METHOD OF FABRICATING SAME

(71) Applicant: SEMES CO., LTD., Cheonan-si (KR)

(72) Inventors: Dong Mok Lee, Cheonan-si (KR); Jin Il Sung, Anseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 175 days.

(21) Appl. No.: 17/408,383

(22) Filed: Aug. 21, 2021

(65) Prior Publication Data

US 2022/0139680 A1 May 5, 2022

(30) Foreign Application Priority Data

Aug. 21, 2020 (KR) .......................... 10-2020-0105066

(51) Int. Cl.
*H01J 37/32* (2006.01)
*H01L 21/683* (2006.01)

(52) U.S. Cl.
CPC .... *H01J 37/32724* (2013.01); *H01L 21/6833* (2013.01); *H01J 2237/2007* (2013.01)

(58) Field of Classification Search
CPC ........ H01J 37/32724; H01J 2237/2007; H01L 21/6833; H01L 21/67103; H01L 21/67109; H01L 21/68742; H01L 21/68785; H01L 21/67126; B23Q 3/15; H02N 13/00
USPC ........................................................ 361/234
See application file for complete search history.

(56) References Cited

U.S. PATENT DOCUMENTS

| 10,340,171 | B2 | 7/2019 | Pape | |
|---|---|---|---|---|
| 10,892,197 | B2 | 1/2021 | Gaff et al. | |
| 2005/0042881 | A1* | 2/2005 | Nishimoto | H01L 21/6833 361/234 |
| 2014/0376148 | A1* | 12/2014 | Sasaki | B23Q 3/15 361/234 |
| 2016/0276196 | A1* | 9/2016 | Parkhe | H01L 21/67103 |
| 2018/0366379 | A1* | 12/2018 | Gaff | H01J 37/32532 |

FOREIGN PATENT DOCUMENTS

| CN | 110875230 A | * | 3/2020 | ............. B05C 13/02 |
|---|---|---|---|---|
| KR | 10-2015-0076132 | | 7/2015 | |
| KR | 10-2017-0130284 | | 11/2017 | |

OTHER PUBLICATIONS

Office Action from the Korean Intellectual Property Office dated Apr. 15, 2023.

* cited by examiner

*Primary Examiner* — Thienvu V Tran
*Assistant Examiner* — Sreeya Sreevatsa

(57) ABSTRACT

A substrate processing apparatus and a method of fabricating the same are proposed. A bonding layer, by which a chuck body and a base plate of an electrostatic chuck device are bonded, is completely covered using a double-sealing structure in which a covering member for preventing a processing gas from infiltrating into the bonding layer and a sealing member for preventing the bonding layer from being damaged are bonded to each other. The durability and the efficiency of the operation of the electrostatic chuck device are improved.

12 Claims, 12 Drawing Sheets

SUBSTRATE PROCESSING APPARATUS AND METHOD OF FABRICATING SAME

CROSS REFERENCE TO RELATED APPLICATION

The present application claims priority to Korean Patent Application No. 10-2020-0105066, filed Aug. 21, 2020, the entire contents of which are incorporated herein for all purposes by this reference.

BACKGROUND OF THE INVENTION

Field of the Invention

The present disclosure relates generally to a substrate processing apparatus and a method of fabricating the same and, more particularly, to a technology for completely covering a bonding layer, by which a chuck body and a base plate of an electrostatic chuck (ESC) device are bonded, using a double-sealing structure in which a covering member for preventing a processing gas from infiltrating into the bonding layer and a sealing member for preventing the bonding layer from being damaged are bonded to each other, thereby improving the durability and the efficiency of the operation of the electrostatic chuck device.

Description of the Related Art

Generally, an electrostatic chuck device is used to hold a substrate while a variety of processes, such as etching, cleansing, exposure, and deposition, are performed on the substrate in a processing chamber.

An electrostatic chuck device may generally include a chuck body configured to attract and hold a substrate and a base plate located below the bottom surface of the chuck body to support the chuck body.

The chuck body may be provided with a heater, by which a temperature to which the substrate is heated may be adjusted. An electrode is buried in the chuck body. With this configuration, the chuck body attracts and holds the substrate on the top surface thereof using electrostatic chucking force generated by coupling caused by a power source. In this position, substrate processing may be performed.

In addition, a bonding layer for bonding the chuck body and the base plate is provided such that the chuck body and the base plate are bonded to each other through the bonding layer.

Typically, a bonding material from which the bonding layer is made may be damaged by a processing gas or the like in a processing environment within a chamber. Such damage in the bonding material may produce contaminants within the chamber, thereby significantly reducing the yield of the processing.

In order to prevent the bonding layer from being damaged as above, a sealing layer for protecting the bonding layer is disposed on the periphery of the bonding layer. As a sealing material, from which the sealing member is made, a synthetic resin, such as polytetrafluoroethylene (PTFE), produced by polymerizing olefin containing fluorine may be used.

The sealing member has strong etch resistance, and can block the bonding layer from being directly or indirectly exposed to the processing gas or the like, thereby preventing to some extent the bonding layer from being etched. However, when the sealing member is disposed on the periphery of the bonding layer, the sealing member may be stretched. Consequently, there may be problems in that the periphery of the bonding layer may not be completely sealed, and a fine gap may be formed in the surface of the sealing member. This is because the processing gas, such as a plasma gas, infiltrates into the bonding layer, thereby etching or decomposing the bonding layer little by little. As this phenomenon is accumulated, a hot spot is formed in a location near the periphery of an electrostatic chuck, and the possibility that particles and contamination may occur is increased.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent Document 1) Korean Patent Application Publication No. 10-2019-0124348 (Nov. 4, 2019)

SUMMARY OF THE INVENTION

Accordingly, the present disclosure has been made keeping in mind the above problems occurring in the related art, and the present disclosure is intended to overcome the problem in that a processing gas or the like infiltrates through a fine gap formed in a sealing member for protecting a bonding layer so that the bonding layer is corroded or etched.

In particular, the present disclosure is also intended to prevent contaminants from being produced within a chamber due to the corrosion or etching of the bonding layer and to overcome the problem in that a hot spot is formed in a location near the periphery of an electrostatic chuck and the possibility of contamination is increased along with the accumulation of the phenomenon in which the bonding layer is etched or decomposed little by little due to the processing gas, such as a plasma gas, infiltrating into the bonding layer.

In order to achieve the above objective, according to one aspect of the present disclosure, there is provided a substrate processing apparatus including: a chuck body configured to attract and hold a substrate; a base plate located below the chuck body to support the chuck body; a bonding layer bonding the chuck body and the base plate; a sealing member provided around a side surface of the bonding layer to prevent the bonding layer from being damaged; and a covering member covering the bonding layer to prevent a processing gas from infiltrating into the bonding layer, wherein a double-sealing structure of the covering member and the sealing member is provided.

The covering member may cover the bonding layer in a portion of a space between the chuck body and the base plate while surrounding the side surface of the bonding layer. The sealing member may be inserted in the space between the chuck body and the base around a side surface of the covering member.

The covering member may cover the bonding layer in the entirety of a space between the chuck body and the base plate around the side surface of the bonding layer. At least a portion of the sealing member may be inserted into the covering member and provided in the space between the chuck body and the base plate along the covering member.

The sealing member may be provided in a space between the chuck body and the base plate around a side surface of the covering member. The covering member may surround at least a portion of the sealing member so as to fill the hollow space between the chuck body and the base plate in which the sealing member is located.

The covering member may contain a thermosetting resin.

The covering member may contain a fluorine resin.

The covering member may contain a thermal conductive additive, by which the thermal conductivity of the covering member is adjusted to be in a predetermined error range of the thermal conductivity of the bonding layer.

The sealing member may have a circular or polygonal cross-section. The covering member may correspond to the cross-section of the sealing member to surround at least a portion of the sealing member facing the bonding layer.

The sealing member and the covering member may be made from different materials.

The sealing member may be replaceable, in separation from the covering member.

According to another aspect of the present disclosure, there is provided a method of fabricating a substrate processing apparatus, the method including: forming a bonding layer by which a chuck body configured to attract and hold a substrate and a base plate located below the chuck body to support the chuck body are bonded; and sealing the bonding layer by forming a covering member covering the bonding layer to prevent a processing gas from infiltrating into the bonding layer and a sealing member preventing the bonding layer from being damaged, thereby forming a double-sealing structure of the covering member and the sealing member.

The sealing of the bonding layer may include: forming the covering member covering the bonding layer by injecting a covering material into a space between the chuck body and the base plate around a side surface of the boding layer to coat at least a portion of the chuck body and the base plate defining the space, followed by curing; and forming the sealing member by inserting a sealing material into the space between chuck body and the base plate on peripheral portions of the covering member.

In the forming of the covering member, the covering material may be injected into the space between the chuck body and the base plate to coat a portion of the space around the side surface of the boding layer and be cured to fill the portion of the space between chuck body and the base plate around the side surface of the boding layer. In the forming of the sealing member, the sealing material may be injected into a remaining portion of the space between chuck body and the base plate after the foaming of the covering member.

The sealing of the bonding layer may include: injecting the covering material to fill at least a portion of the space between the chuck body and the base plate around a side surface of the boding layer; injecting the sealing material into a portion of the space between the chuck body and the base plate into which the covering member is injected so as to correspond to a portion around the side surface of the boding layer; and curing the covering material to cover the bonding layer.

In the injecting of the covering material, the covering material may be injected to fill the entirety of the space between the chuck body and the base plate. In the injecting of the sealing material, at least a portion of the sealing material directed toward the bonding layer may be injected into the covering material injected into the space. In the curing of the covering material, the covering material may be cured to form the covering member surrounding at least a portion of the sealing member.

In the injecting of the covering material, the covering material may be coated on a top surface and a bottom surface of the space defined between the chuck body and the base plate around a side surface of the bonding layer. In the injecting of the sealing material, the sealing material may be injected so that a top surface and a bottom surface of the sealing material come into contact with the covering material. In the curing of the covering material, the covering material may be cured to form the covering member such that a portion between the chuck body, the base plate, and the sealing member is filled with the covering material.

The covering material of the covering member may include a liquid thermosetting resin. The sealing material of the sealing member may include a solid fluorine resin.

The covering material may include a liquid fluorine resin.

The covering material may contain a thermal conductive additive, the content of which is adjusted such that the thermal conductivity of the covering material is in a predetermined range.

According to another aspect of the present disclosure, there is provided a substrate processing apparatus including: a chuck body made from a dielectric substance, including a heater, by which a temperature to which the substrate is heated is adjusted, and an electrode buried in the chuck body, and configured to attract and hold a substrate on a top surface thereof using electrostatic chucking force generated by coupling caused by a power source; a base plate located below the chuck body to support the chuck body and includes a coolant passage defined therein; a bonding layer bonding the chuck body and the base plate; a covering member covering the bonding layer in a space between the chuck body and the base plate while surrounding a side surface of the bonding layer to prevent a processing gas from infiltrating into the bonding layer, wherein the covering member includes a thermal conductive additive, by which the thermal conductivity of the covering member is adjusted to be in a predetermined error range of the thermal conductivity of the bonding layer; and a sealing member inserted into the space between the chuck body and the base plate around a side surface of the covering member to prevent the bonding layer from being damaged, with at least a portion of the sealing member being surrounded by the covering member, wherein a double-sealing structure of the covering member and the sealing member is provided.

According to the present disclosure as set forth above, in the electrostatic chuck device, it is possible to completely cover the bonding layer using the double-sealing structure, in which the covering member disposed on the periphery or around the bonding layer, by which the chuck body and the base plate are bonded, is bonded to the sealing member. Accordingly, it is possible to improve the durability and the efficiency of the operation of the electrostatic chuck device In particular, it is possible to prevent contaminants from being produced within the chamber due to the corrosion or etching of the bonding layer. It is also possible to overcome the problem in that a hot spot is formed in a location near the periphery of an electrostatic chuck and the possibility of contamination is increased along with the accumulation of the phenomenon in which the bonding layer is etched or decomposed little by little due to the processing gas, such as a plasma gas, infiltrating into the bonding layer.

Furthermore, according to an embodiment of the present disclosure, when the sealing member needs to be replaced due to corrosion or etching, it is possible to only replace the sealing member while maintaining the bonding layer in the covered state. Accordingly, the apparatus may be easily repaired, and the operating cost of the apparatus may be reduced.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

The present disclosure, operational advantages of the present disclosure, and objects achieved by executing the present disclosure will be, hereinafter, described by exemplifying exemplary embodiments of the present disclosure and referring to the exemplary embodiments.

First, terms used in the present application are just used to describe a specific embodiment and do not intend to limit the present disclosure and a singular expression may include a plural expression as long as it is not apparently contextually different. Further, in the present application, it should be understood that the terms "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

In describing the present disclosure, a detailed explanation of related known configurations or functions may be omitted to avoid obscuring the subject matter of the present disclosure.

The present disclosure is intended to provide an electrostatic chuck (ESC) device having a double-sealing structure in which a covering member is provided to prevent a processing gas from infiltrating into a bonding layer, by which a chuck body and a base plate are joined to each other, and a sealing member for preventing the bonding layer from being damaged is bonded to the covering member.

Figure 1:
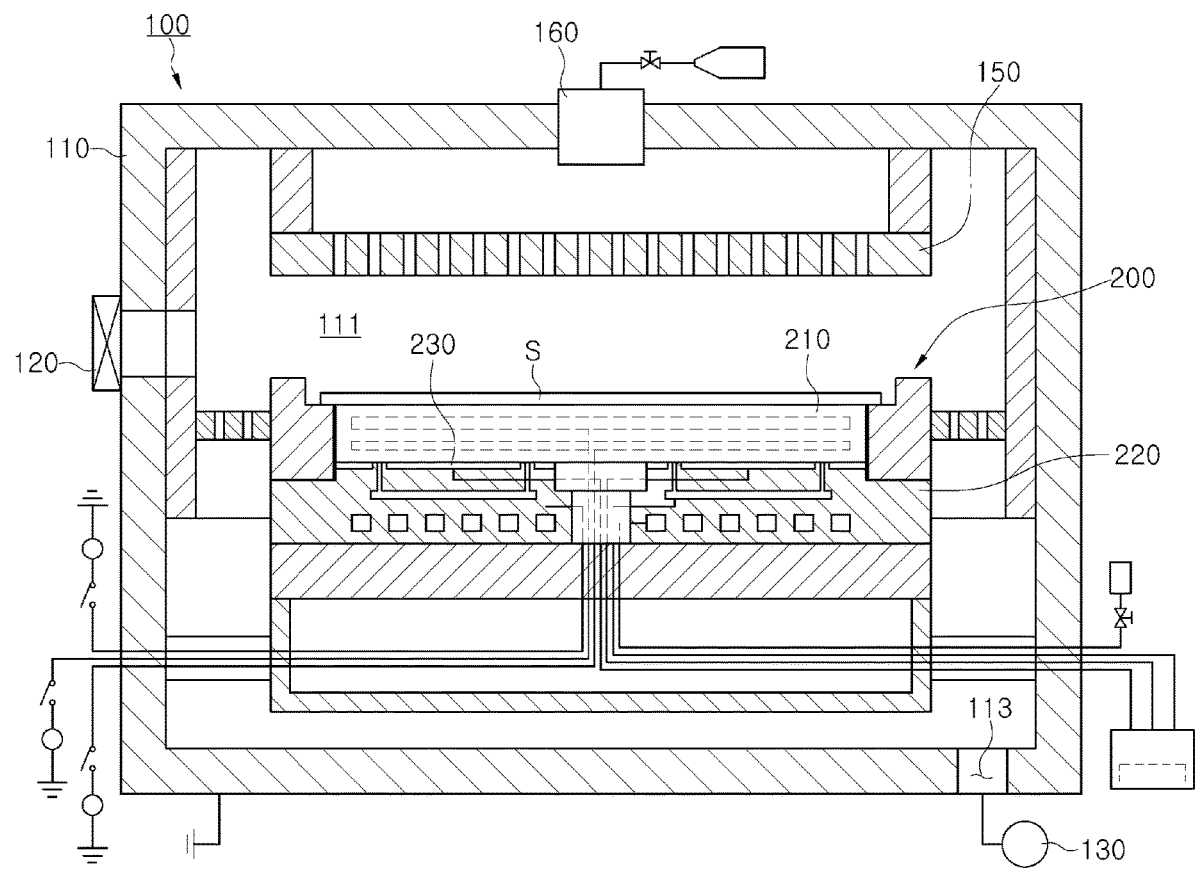
FIG. 1 illustrates a schematic configuration of a substrate processing apparatus according to the present disclosure.

A configuration of an embodiment of a substrate processing apparatus according to the present disclosure is illustrated in FIG. 1. The substrate processing apparatus according to the present disclosure will be described with reference to FIG. 1.

The substrate processing apparatus according to the present disclosure may be applied to a variety of devices configured to hold a substrate S when performing semiconductor processing on the substrate S. For example, the substrate processing apparatus may be selectively used in a plasma etching apparatus, a deposition apparatus, or the like for performing a variety of processes, such as etching, cleansing, imaging, and deposition. More particularly, the substrate processing apparatus may be selectively used in any processing system, such as a plasma etching apparatus, a physical vapor deposition (PVD) apparatus, a chemical vapor deposition (CVD) apparatus, an atomic layer deposition (ALD) apparatus, and an atomic layer etching (ALE) apparatus, related to the fabrication of semiconductor devices. Hereinafter, the substrate processing apparatus regarding an electrostatic chuck provided in an etching process chamber illustrated in FIG. 1 will be described for the convenience of explanation.

The substrate processing apparatus includes a processing chamber 100, an electrostatic chuck device 200 serving as a substrate support assembly, a showerhead 150, a processing gas supply unit 160, an electric field generating unit, and the like. The processing gas supply unit 160 supplies processing gas to be provided into the processing chamber 100, and the electric field generating unit generates an electric field within the processing chamber 100, thereby exciting the processing gas provided into the processing chamber 100 into a plasma state.

The processing chamber 100 provides a substrate processing space 111 that can be isolated from the outside, and the substrate S is processed by the plasma in the substrate processing space 111. The processing chamber 100 includes a chamber body 110 which is defined to have defined the substrate processing space 111 therein. The chamber body 110 may be made from a metal. For example, the chamber body 110 may be made of aluminum (Al). The chamber body 110 may be earthed.

At least one substrate gate communicating with the substrate processing space 111 is provided on the wall of the chamber body 110. A substrate to be processed is introduced into and removed from the substrate processing space 111 through a gate opening/closing unit 120 provided on the substrate gate.

At least one exhaust port 113 communicating with the substrate processing space 111 is provided on the bottom of the chamber body 110. An exhaust unit 130 performing an exhaust function is connected to the exhaust port 113. The exhaust unit 130 may include an exhaust line connected to the exhaust port 113 and a vacuum pump connected to the exhaust line. The exhaust function of the exhaust unit 130 reduces the pressure of the substrate processing space 111, so that the substrate can be processed in a vacuum atmosphere. The exhaust function of the exhaust unit 130 also allows byproducts generated during the substrate processing or gases remaining in the substrate processing space 111 to be evacuated.

The electrostatic chuck device 200 serving as a substrate support assembly is disposed within the chamber body 110. The electrostatic chuck device 200 supports the substrate S during the processing on the substrate S in the substrate processing space 111.

The electrostatic chuck device 200 generally includes a chuck body 210 configured to attract and hold the substrate S on the top surface thereof using electrostatic chuck force and a base plate 220 located below the chuck body 210 to support the chuck body 210. The chuck body 210 and the base plate 220 are joined and bonded to each other through a bonding layer 230.

Figure 2:
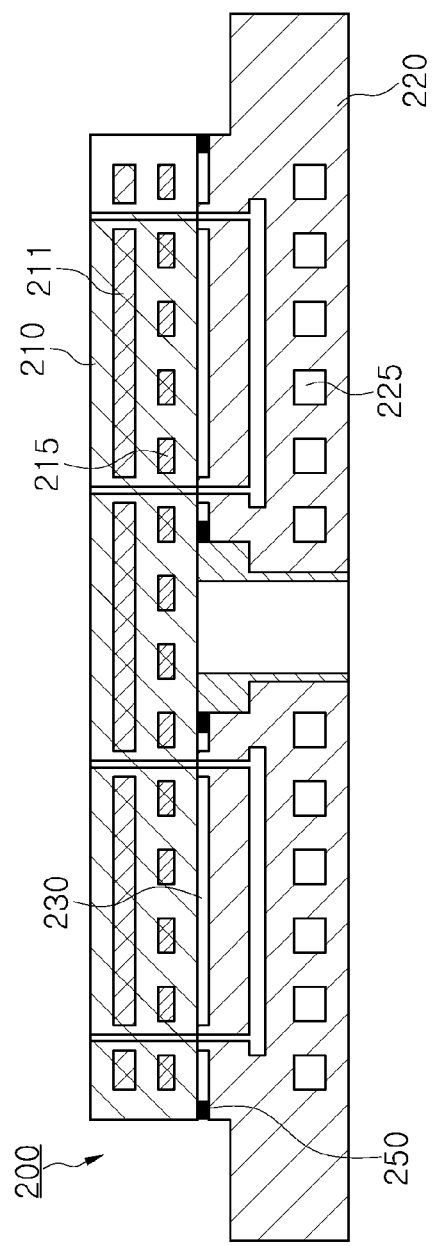
FIG. 2 illustrates a specific configuration of an electrostatic chuck device according to the present disclosure.

A more specific configuration of the electrostatic chuck device 200 will be described with respect to an embodiment illustrated in FIG. 2.

The chuck body 210 may be provided in the shape of a plate, with the top surface thereof being made from a dielectric substance to form a support top surface on which a substrate is placed. A chuck electrode 211 and a heater element 215 may be provided inside the chuck body 210.

The chuck electrode 211 buried in the chuck body 210 generates electrostatic chucking force due to coupling caused by a power source. Due to the chucking force, the substrate to be processed may be attracted and held to the top surface of the chuck body 210.

In addition, the heater element 215 provided inside the chuck body 210 is disposed below the chuck electrode 211 and is electrically connected to a heater power source. The heater element 215 is configured to generate heat due to current resistance in response to power supplied thereto to heat the substrate to a temperature required in the substrate processing.

The base plate 220 is electrically connected to a high frequency power source. The high frequency power source may be implemented as a radio frequency (RF) power source. The base plate 220 may receive high frequency power from the high frequency power source and serve as a lower electrode of the electric field generating unit.

In addition, a cooling element 225 is provided in the base plate 220. As a configuration of the cooling element, a cooling passage through which a cooling fluid flows is provided inside the base plate 220. The cooling passage is connected to a cooling fluid source to cool the base plate 220. It is possible to cool the substrate to be cooled together with the chuck body 210 by cooling the base plate 220, thereby cooling the substrate to a temperature required for the substrate processing.

The chuck body 210 and the base plate 220 are joined and bonded to each other through the bonding layer 230. The bonding layer 230 may be foamed to be thermally conductive in the bonding of the chuck body 210 and the base plate 220, so that the substrate may have a suitable temperature required for the processing. For example, the bonding layer 230 may include or may be formed of a silicone layer impregnated with silica.

When the bonding layer 230 is corroded or etched by exposure to the processing gas or the like, the corrosion or etching of the bonding layer 230 may serve as a reason that produces contaminants in the substrate processing space, thereby significantly reducing the yield of the processing. In addition, when the bonding layer 230 is damaged, the bonding layer 230 must be replaced, thereby serving as a reason for reducing the efficiency of the operation of the apparatus. Thus, a sealing structure including a sealing member disposed on the periphery of the bonding layer 230 to protect the bonding layer 230 from damage is used. The present disclosure discloses a double-sealing structure 250 as a novel sealing structure.

The double-sealing structure proposed by the present disclosure is a novel sealing structure able to overcome the problems of the related-art sealing structure, thereby more reliably and effectively preventing damage to the bonding layer, i.e., preventing the bonding layer from, for example, being corroded or etched. Hereinafter, the sealing structure according to the present disclosure will be described in detail with respect to embodiments thereof.

Figure 3:
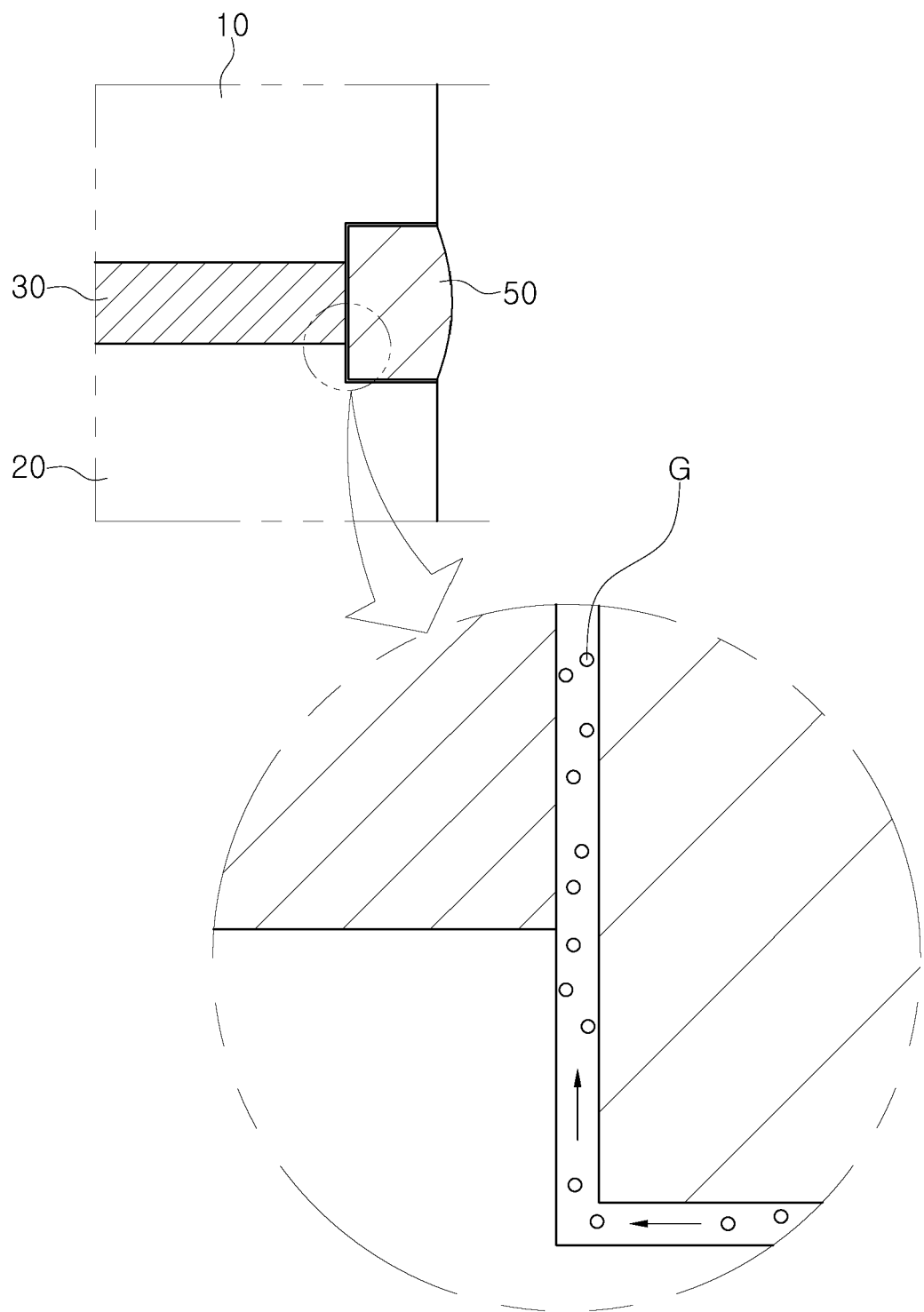
FIG. 3 illustrates an example of a sealing structure of the related art.

In the related art, a sealing member for protecting the bonding layer is disposed on the periphery of the bonding layer to prevent the bonding layer from being damaged. FIG. 3 illustrates an example of the sealing structure of the related art.

A chuck body 10 and a base plate 20 are joined and bonded to each other through a bonding layer 30. A sealing member 50 is disposed on the periphery of the bonding layer 30. The sealing member 50 protects the bonding layer 30 from direct contact with a plasma environment and corrosive chemicals.

For etch resistance to the processing gas or the like, the sealing member 50 is implemented as a sealing band made from fluorine resin rubber, such as polytetrafluoroethylene (PTFE). When this sealing member is applied, the disposed sealing member may be stretched or extend, thereby disadvantageously forming a fine gap in a contact portion of the sealing member. In addition, the bonding layer may not be completely covered, due to the machining error of the sealing member.

As illustrated in FIG. 3, the fine gap is formed in the contact portion of the sealing member, and the processing gas G infiltrates into the bonding layer 30 through the fine gap during the processing. Even in the case that only a minute amount of processing gas infiltrates into the bonding layer 30, the infiltration of the processing gas etches and decomposes the bonding layer little by little. As this phenomenon is accumulated for a long period of time, a hot spot is formed in a location near the periphery of the electrostatic chuck device, and the possibility that particles and contamination may occur is increased.

In order to overcome this problem, the present disclosure proposes a novel sealing structure including a sealing member provided around the side surface of the bonding layer to prevent the bonding layer from being damaged and a covering member covering the bonding layer in order to prevent the processing gas from infiltrating into the bonding layer. This sealing structure may remove a fine gap from being formed in the sealing member, thereby completely covering the bonding layer.

Figure 4A:
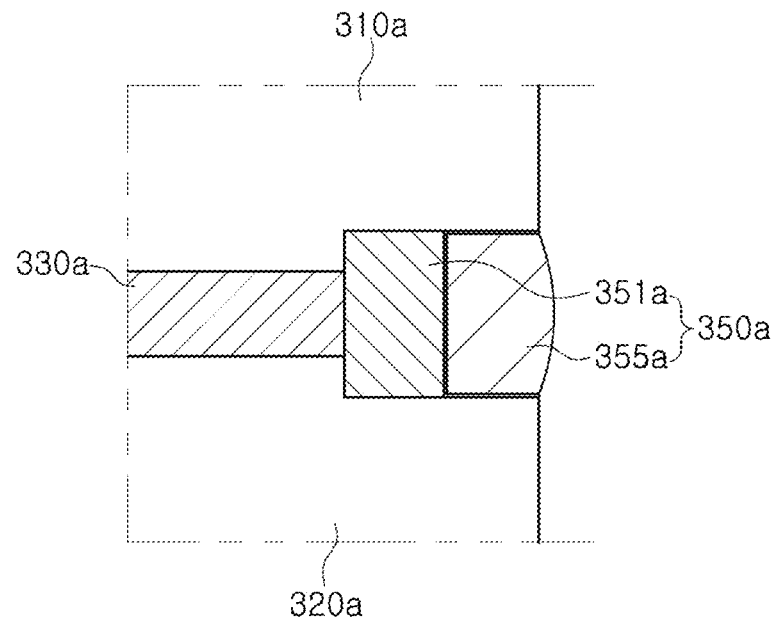
FIGS. 4A and 4B illustrate a first embodiment of the substrate processing apparatus according to the present disclosure.
Figure 4B:
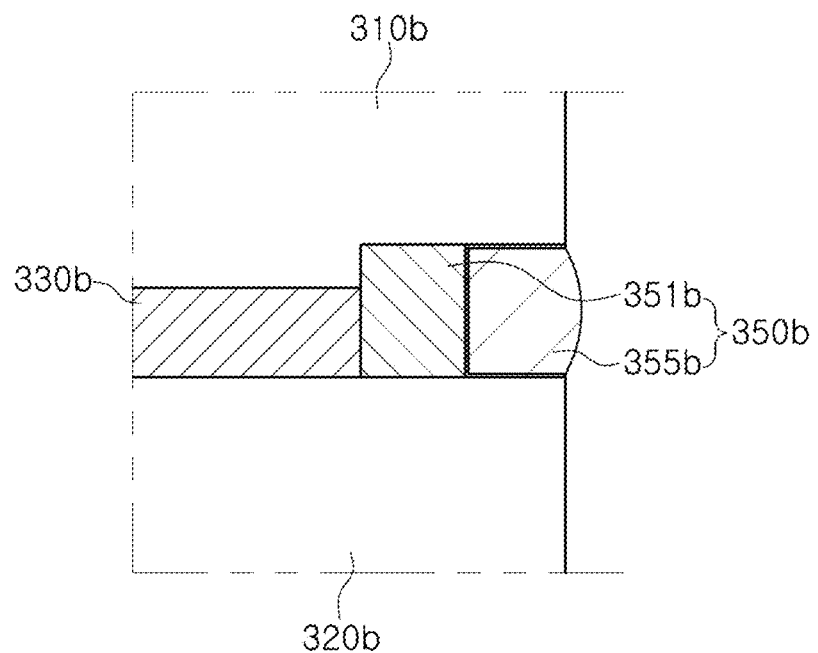

FIGS. 4A and 4B illustrate a first embodiment of the substrate processing apparatus according to the present disclosure.

In FIG. 4A, a double sealing structure according to the present disclosure is provided around a bonding layer 330a, by which a chuck body 310a configured to attract and hold a substrate and a base plate 320a located below the chuck body 310a to support the chuck body 310a are bonded to each other.

More particularly, external edges of the chuck body 310a and the base plate 320a are stepped inward with respect to the bonding layer 330a, thereby defining a space between the chuck body 310a and the base plate 320a around the side surface of the bonding layer 330a. In addition, a covering member 351a is provided in a portion of the space between a chuck body 310a and a base plate 320a while surrounding the side surface of the bonding layer 330a, and a sealing member 355a is inserted into the space between the chuck body 310a and the base plate 320a around the side surface of the covering member 351a.

That is, a double-sealing structure 350a comprised of the covering member 351a and the sealing member 355a is provided by forming the covering member 351a around the bonding layer 330a to cover the bonding layer 330a and disposing the sealing member around the side surface of the covering member.

In an embodiment, the chuck body 310a may include a first lower surface 310a-L1, a second lower surface 310a-L2, and a third lower surface 310a-L3 connecting the first lower surface 310a-L1 to the second lower surface 310a-L2. An upper surface of the base plate 320a may include a first portion 320a-U1 and a second portion 320a-U2 which is located at a lower position than the first portion 320a-U1. The second lower surface 310a-L2 is higher than the first lower surface 310a-L1. The bonding layer 330a is disposed between the first lower surface 310a-L1 of the chuck body 310a and the first portion 320a-U1 of the upper surface of the base plate 320a. A side surface 330a-S of the bonding layer 330a is vertically aligned with the third lower surface 310a-L3 of the chuck body 310a.

Furthermore, the double-sealing structure may be modified various according to the shape of the space defined between the chuck body and the base plate. For example, as illustrated in FIG. 4B, while a chuck body 310b is configured such that the external edges thereof are stepped inward with respect to a bonding layer 330b, a base plate 320b may be configured to have a flat structure without a stepped portion. In addition, a covering member 351b is configured to surround the side surface of the bonding layer 330b and is formed in a portion of the space between the chuck body 310b and the base plate 320b to cover the bonding layer 330b. A sealing member 355b is inserted into the space between the chuck body 310b and the base plate 320b around the side surface of the covering member 351b.

As described above, the double-sealing structure according to the present disclosure may be modified and selected properly according to the shape of the apparatus to which the double-sealing structure is applied.

In the first embodiment, as described above, a fine gap may be formed on the surface of in the sealing member in contact with the chuck body and the base plate. However, the covering member is provided inside the sealing member to surround the periphery of the bonding layer. Even when the processing gas or the like infiltrates through the fine gap of the sealing member, the covering member may block the processing gas from infiltrating to the bonding layer, thereby completely covering the bonding layer.

Figure 5:
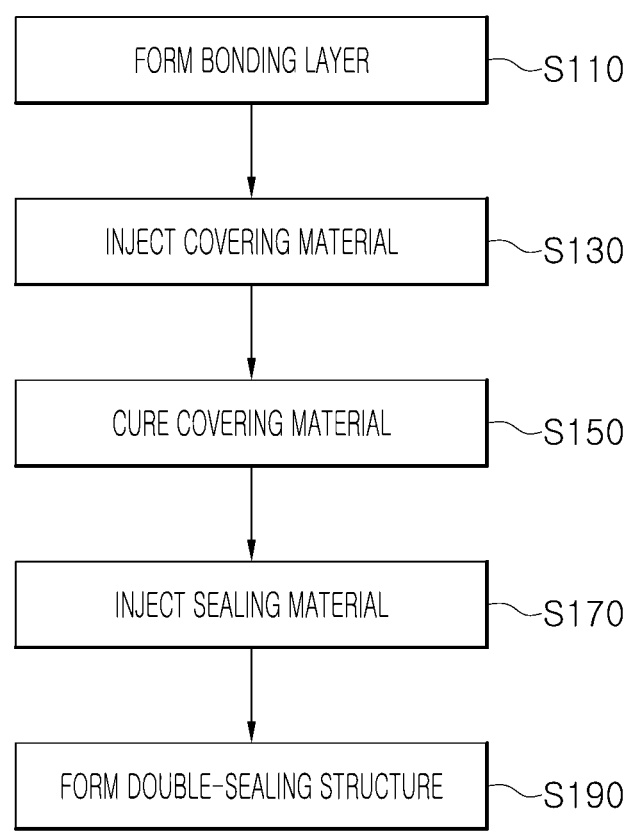
FIG. 5 illustrates a flowchart of a method of fabricating the first embodiment of the substrate processing apparatus according to the present disclosure.

The present disclosure also proposes a method of fabricating the substrate processing apparatus. FIG. 5 illustrates a flowchart of a method of fabricating the first embodiment of the substrate processing apparatus according to the present disclosure, and FIGS. 6A to 6D illustrate a schematic process regarding the first embodiment.

Figure 6A:
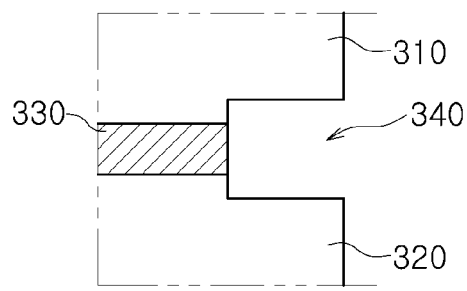
FIGS. 6A to 6D illustrate a schematic process regarding the first embodiment.

First, as illustrated in FIG. 6A, a bonding layer 330, by which a chuck body 310 configured to attract and hold a substrate and a base plate 320 located below the chuck body 310 to support the chuck body 310 are joined and bonded to each other, is formed in S110.

In this situation, the external edges of the chuck body 310 and the base plate 320 are stepped inward with respect to the bonding layer, thereby defining a space 340 between the chuck body 310 and the base plate 320 around the side surface of the bonding layer.

Figure 6B:
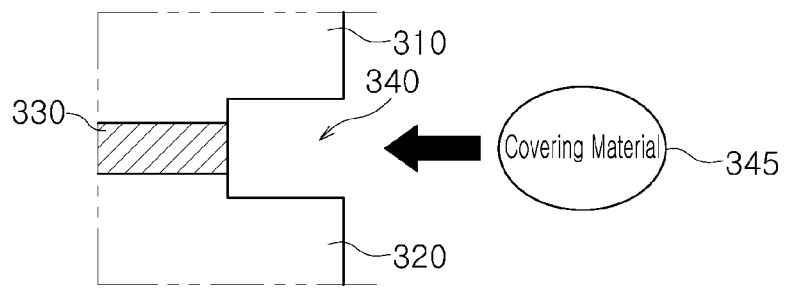

When the bonding layer is formed, as illustrated in FIG. 6B, a covering material 345 is injected into the space 340 between the chuck body 310 and the base plate 320 around the side surface of the bonding layer in S130. Here, the covering material is coated on a portion of the space 340 between the chuck body 310 and the base plate 320 around the side surface of the bonding layer and then is cured in S150, thereby forming a covering member. Particularly, the covering material may be injected in the liquid form into the space between the chuck body 310 and the base plate 320. In some cases, the covering material may be injected in the form of a gas so as to be coated on the portion of the space.

Figure 6C:
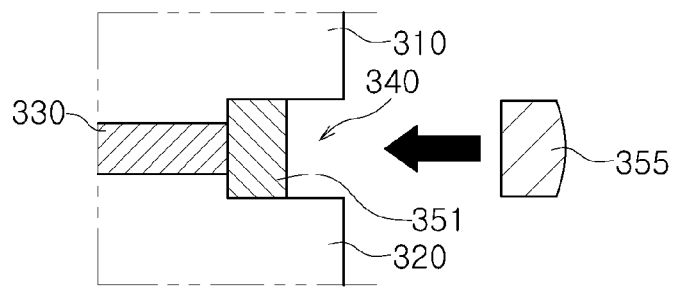
Figure 6D:
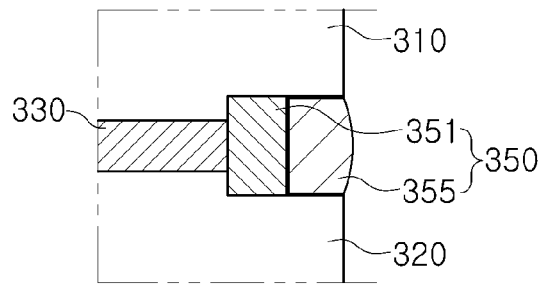

In addition, as illustrated in FIG. 6C, the sealing material is injected into the space 340 between the chuck body 310 and the base plate 320 around the covering member 351 in S170 and is machined to be compliant with the shape of the space 340, thereby foaming a sealing member 355 as illustrated in FIG. 6D. Here, the sealing material may be provided as a solid material, the shape of which is adjustable, or in some cases, as a gel, so that the sealing material may be cured after the shape thereof is completed.

According to the above-described processing, a double-sealing structure 350 is provided by bonding the covering member 351 able to prevent the processing gas or the like from infiltrating into the bonding layer to the sealing member 355.

In the double-sealing structure of the first embodiment illustrated in FIG. 4, fabricated by the processing illustrated in FIG. 5 and FIGS. 6A to 6D, the sealing member is provided after the covering member is formed by curing and thus is detachably bonded to the covering member.

Figure 7:
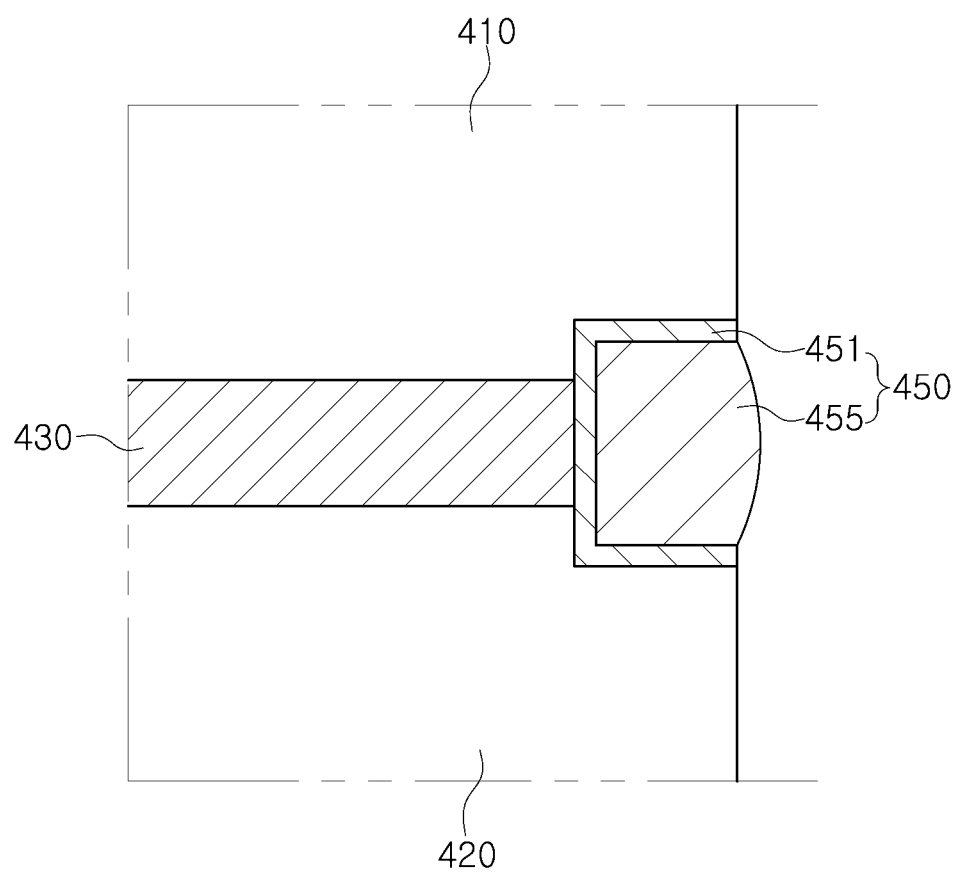
FIG. 7 illustrates a flowchart of a method of fabricating a second embodiment of the substrate processing apparatus according to the present disclosure.

FIG. 7 illustrates a flowchart of a method of fabricating a second embodiment of the substrate processing apparatus according to the present disclosure.

Also in FIG. 7, a double-sealing structure 450 according to the present disclosure is provided around a bonding layer 430 bonding a chuck body 410 and a base plate 420. Here, the double-sealing structure 450 is configured such that a covering member 451 is coupled integrally to a sealing member 455 while surrounding a portion of the sealing member 455.

That is, the double-sealing structure may be configured such that all surfaces in contact with the space between the chuck body 410 and the base plate 420 and in contact with the sealing member 455 are surrounded by the covering member 451. In some cases, the covering member may be configured to occupy the entirety of the space between the chuck body 410 and the base plate 420, or at least a portion of the sealing member may be inserted into the covering member to be surrounded by the covering member. Alternatively, the sealing member may be located in the space between the chuck body and the base plate, and the covering member may be formed to surround a portion of the sealing member so as to occupy the hollow space between the chuck body and the base plate in which the sealing member is located.

In the second embodiment, the double-sealing structure is configured such that at least a portion of the sealing member is surrounded by the covering member and the space between the chuck body and the base plate is completely filled. Thus, the fine gap on the contact surface of the sealing member is filled with the covering member. Accordingly, it is possible to prevent the processing gas from infiltrating into the bodying layer, thereby completely covering the bonding layer.

Figure 8:
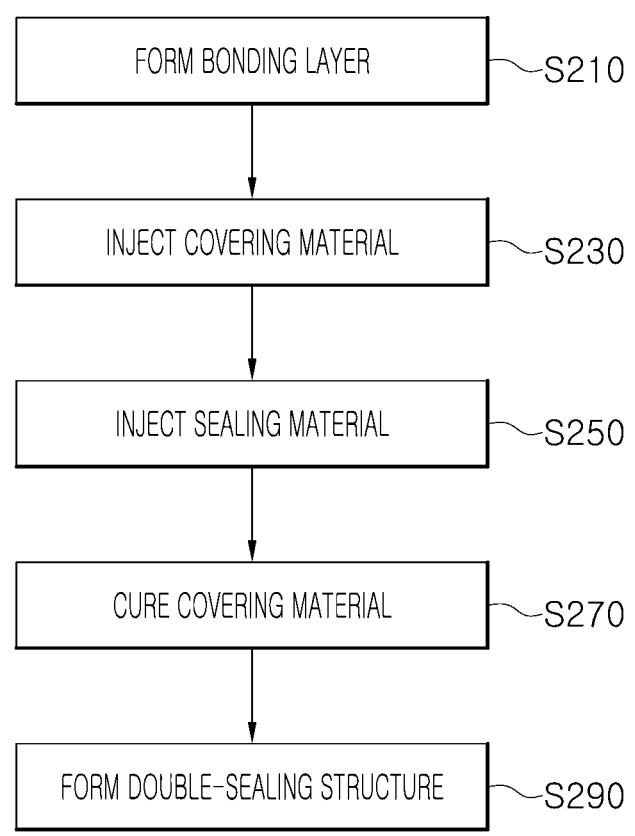
FIG. 8 illustrates a flowchart of a method of fabricating the second embodiment.

In relation to the second embodiment illustrated in FIG. 7, FIG. 8 illustrates a flowchart of a method of fabricating the second embodiment, and FIGS. 9A to 9D illustrates a schematic process.

Figure 9A:
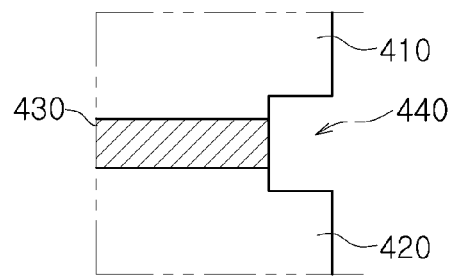
FIGS. 9A to 9D illustrates a schematic process regarding the second embodiment.

First, as illustrated in FIG. 9A, a bonding layer 430, by which the chuck body 410 configured to attract and hold a substrate and the base plate 420 located below the chuck body 410 to support the chuck body 410 are joined and bonded to each other, is formed in S210.

Figure 9B:
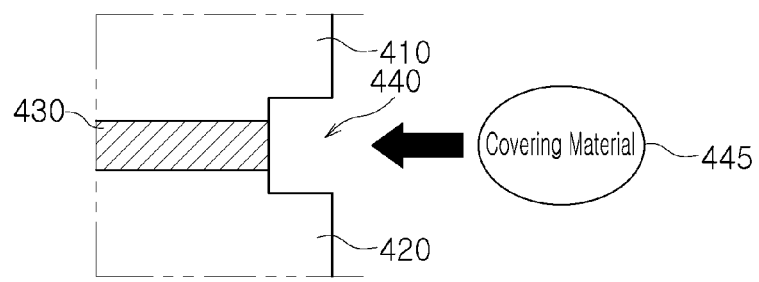

When the bonding layer 430 is formed, as illustrated in FIG. 9B, the covering material 445 is injected into the space 440 between the chuck body 410 and the base plate 420 around the side surface of the bonding layer 430 in S230. Here, the covering material 445 may be injected in a sufficient amount to fill the entirety of the space 440 between the chuck body 410 and the base plate 420 around the side surface of the bonding layer 430 or at least a predetermined portion of the space 440. The covering material may be injected in the liquid form into the space 440 between the chuck body 410 and the base plate 420.

Figure 9C:
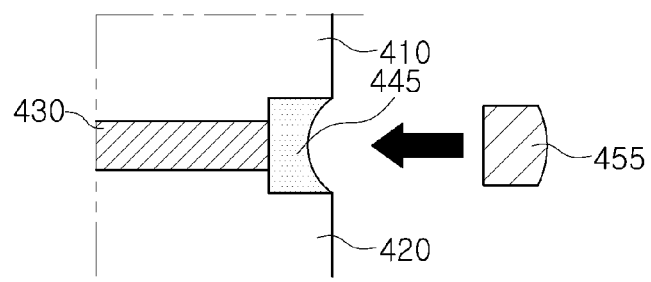

In addition, as illustrated in FIG. 9C, the sealing material is injected into the space 440 between the chuck body 410 and the base plate 420 into which the covering material 445 is injected. Here, the sealing material may be provided as a solid material, or in some cases, may be provided as a gel, so that the shape thereof is adjustable.

Figure 9D:
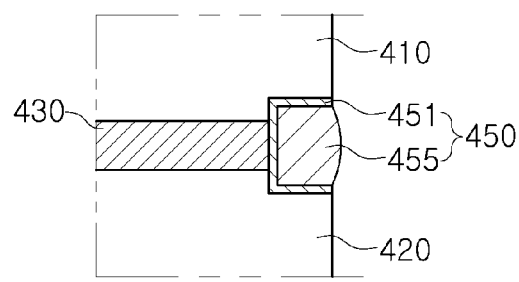

After at least a portion of the sealing material is injected into the covering material 445, the covering material is cured in S270. As illustrated in FIG. 9D, the double-sealing structure 450 in which at least a portion of the sealing member 455 is inserted into and integrated with the covering member 451 is formed in S290.

In the double-sealing structure of the second embodiment illustrated in FIG. 7, fabricated by the processing illustrated in FIG. 8 and FIGS. 9A to 9D, the sealing member is inserted into the covering material and then is cured, and thus, the sealing member and the covering material are bonded integrally to each other. In particular, in the double-sealing structure as described above, the surface of the sealing member is surrounded by the covering member, and thus, a fine gap that would be formed in the surface of the sealing member may be filled with the covering member, thereby completely preventing the processing gas from infiltrating into the bonding layer.

Figure 10:
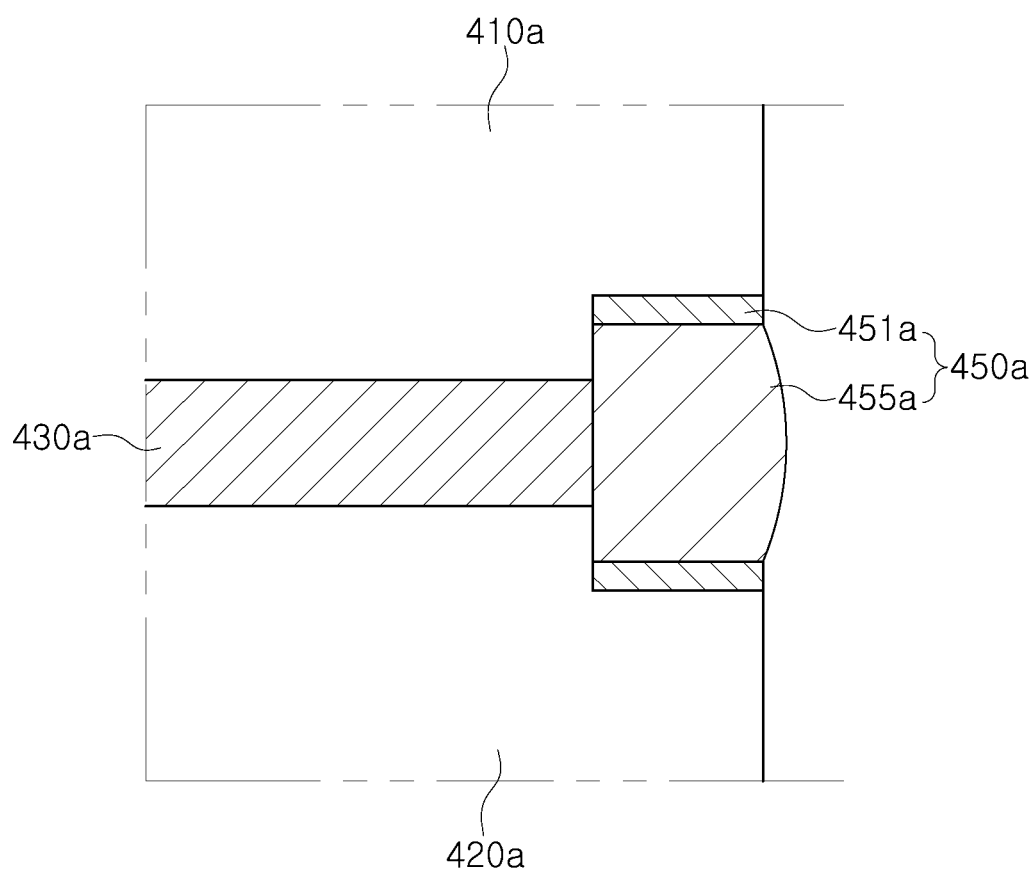
FIG. 10 illustrates a third embodiment of the substrate processing apparatus according to the present disclosure.

Furthermore, FIG. 10 illustrates a third embodiment of the substrate processing apparatus according to the present disclosure. The third embodiment illustrated in FIG. 10 proposes a double-sealing structure 450a, in which covering members 451a are formed on the top portion and the bottom portion of a space defined by a chuck body 410a and a base plate 420a around the side surface of a bonding layer 430a, and a sealing member 455a is inserted into the space between the covering members 451a.

That is, the third embodiment proposes the double-sealing structure 450a in which the sealing member 455a and the covering members 451a are integrated so that a fine gap occurring in the surface of the sealing member 455a in contact with the chuck body 410a and the base plate 420a is filled with a portion of the covering members 451a.

In the third embodiment as described above, in order to cover the bonding layer 430a by filling the fine gap occurring in the contact surface of the sealing member 455a with the covering members 451a, the fabrication process as described above with reference to FIG. 8 and FIGS. 9A to 9D are modified, so that the top portion and the bottom portion of the space defined by the chuck body 410a and the base plate 420a around the side surface of the bonding layer 430a is coated by injecting the covering material into the space, after the sealing material is inserted into the space so that the top portion and the bottom portion thereof are in contact with the covering material, the covering material is cured. Accordingly, it is possible to form the covering members 451a in which the space between the chuck body 410a, the base plate 420a, and the sealing member 455a is filled with the covering material.

The covering material as described above may be implemented as a thermosetting resin. Particularly, the covering material may include or may be formed of a fluorine resin-based material. In this regard, the covering material may contain a thermosetting resin. Particularly, the covering material may include or may be formed of a liquid material properly selected from among fluorine resin-based materials, such as PTFE, PCTFE, FKM, and FFKM.

In addition, the sealing material foam the sealing member may be a solid material properly selected from among solid fluorine resin-based materials, such as PTFE, PCTFE, FKM, and FFKM, or a gel material, in consideration of etch resistance regarding the processing gas.

Although the covering member and the sealing member may be made from the same fluorine resin-based material, the covering member and the sealing member may be made from different materials in order to facilitate future replacement of the sealing member.

Furthermore, each of the thermal conductivities of the covering member and the sealing member of the double-sealing structure may be adjusted to be within a predetermined error range from the thermal conductivity of the bonding layer. In this regard, the thermal conductivity of the covering member may be adjusted by configuring the covering material forming the covering member to contain a thermal conductive additive. For example, the thermal conductivity of the covering member to be formed may be adjusted by configuring a thermosetting resin, such as epoxy, serving as the covering material to contain a carbon-based thermal conductive additive. Particularly, the content of the thermal conductive additive added to the covering material may be adjusted so that the thermal conductivity of the covering member may be adjusted in the range of from 0.1 W/mK to 5 W/mK, in consideration of the thermal conductivity of the bonding layer.

Furthermore, the sealing member of the double-sealing structure may have a variety of shapes, in consideration of the ease of mounting. Accordingly, the covering member may be configured to correspond to the cross-sectional shape of the sealing member such that the covering member surrounds at least a portion of the sealing member facing the bonding layer.

Figure 11A:
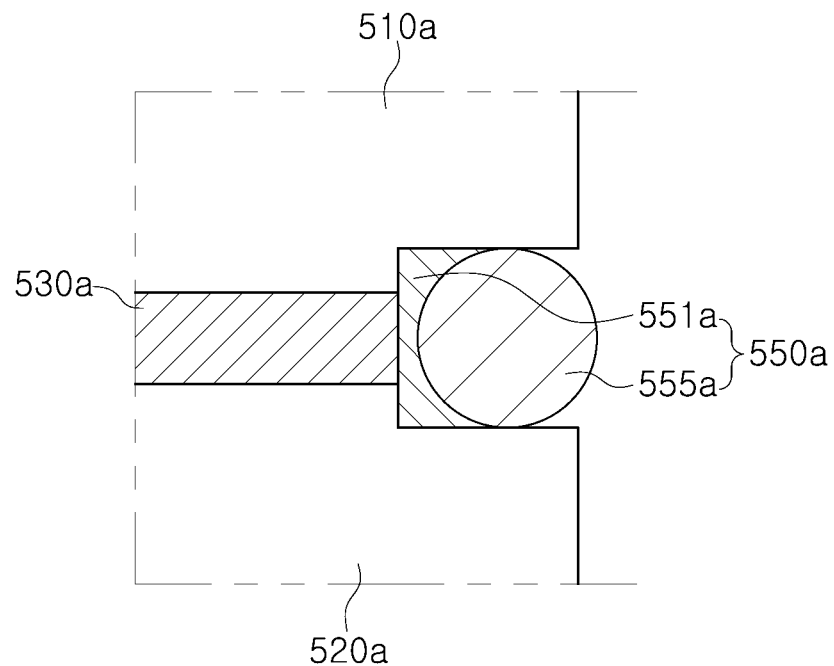
FIGS. 11A and 11B illustrate an embodiment to which sealing members having a variety of shapes are applicable.
Figure 11B:
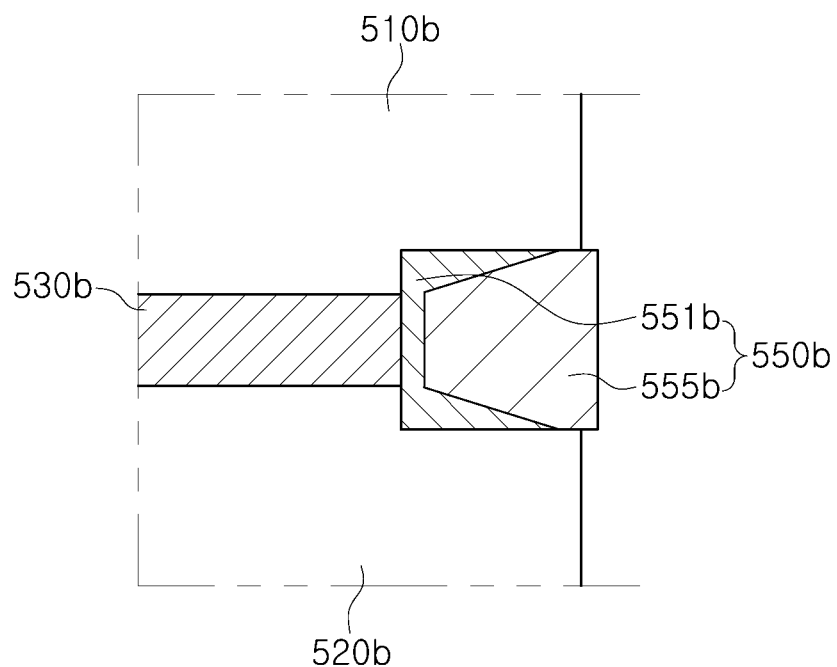

In this regard, FIGS. 11A and 11B illustrate an embodiment to which sealing members having a variety of shapes are applicable.

In the present disclosure, the sealing member having a circular or polygonal cross-sectional shape may be provided, depending on the shape of a portion on which the sealing member is disposed, the characteristics or processibility of the sealing material, or the like. FIG. 11A illustrates a situation in which a sealing member 555a has a circular cross-section. The sealing member 555a having a circular cross-section is formed on the external edge of a bonding layer 530a, in a space between a chuck body 510a and a base plate 520a. A covering member 551a may be configured to correspond to the circular cross-sectional shape of the sealing member 555a so as to surround a portion of the sealing member 555a facing the bonding layer 530a.

In addition, FIG. 11B illustrates a situation in which a sealing member 555b has a polygonal cross-sectional shape, with the vertical length thereof decreasing in the inward direction. When the sealing member 555b having this shape is used, it is possible to more easily dispose the sealing member 555b in a space between the chuck body 510b and the base plate 520b. Thus, stronger hermetic sealing is possible. Accordingly, the covering member 551b may be configured to correspond to the polygonal cross-section of the sealing member 555b so as to surround a portion of the sealing member 555b facing the bonding layer 530b.

As described above, by foiling the double-sealing structure 550a in which the covering member 551a or 551b and the sealing member 555a or 555b are bonded in a corresponding manner, the sealing structure having a variety of shapes may be used.

The present disclosure is intended to facilitate the repairing of the sealing member with respect to the bonding layer while maintaining the covering of the bonding layer. In this regard, FIGS. 12A to 12D illustrate a process of repairing the sealing member with respect to the bonding layer.

The repairing of the sealing member illustrated in FIG. 12A to 12D may properly use the first embodiment of the double-sealing structure illustrated in FIGS. 4A and 4B. In the fabrication process illustrated in FIG. 5 and FIGS. 6A to 6D, the double-sealing structure is formed by forming and curing the covering member before mounting the sealing member. In this double-sealing structure, the covering member and the sealing member may be bonded in a physically dividable manner.

The sealing member may be directly exposed to the environment of the internal space of the chamber, and thus, be damaged by corrosion or etching through contact with a variety of materials used in the processing. In such a situation, the sealing member needs to be repaired.

Figure 12A:
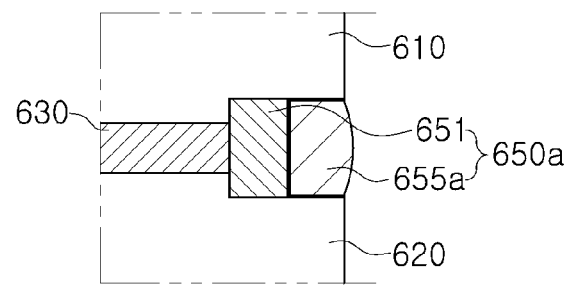
FIGS. 12A to 12D illustrate a process of repairing the sealing member with respect to the bonding layer according to the present disclosure.
Figure 12B:
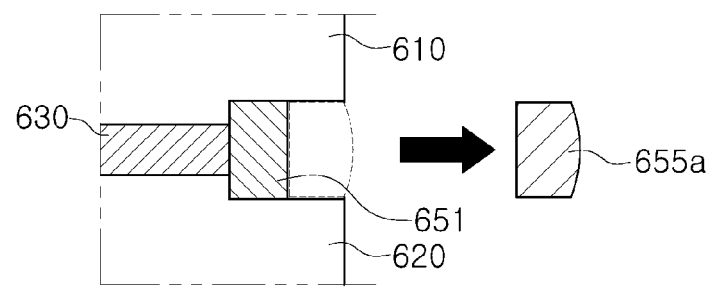

Thus, when the sealing member 655a of the double-sealing structure 650a is damaged to at least a predetermined extent as illustrated in FIG. 12A, it is possible to remove the damaged sealing member 655a while maintaining the covering member 651 so as to keep the bonding layer 630 covered as illustrated in FIG. 12B.

Figure 12C:
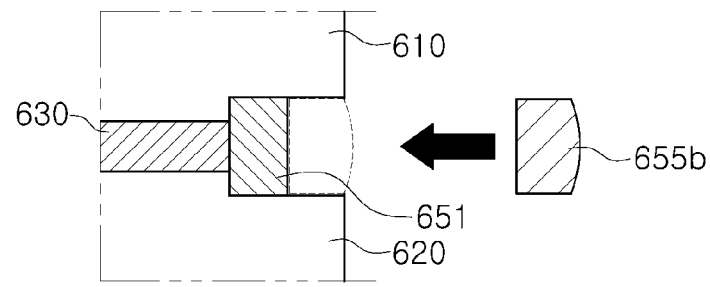
Figure 12D:
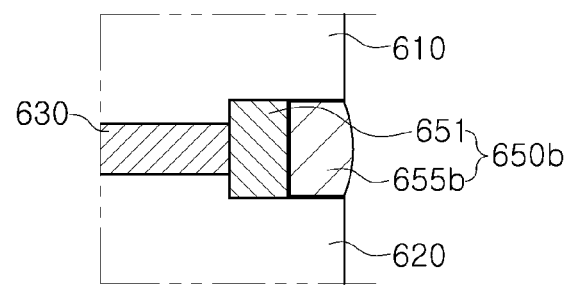

In addition, when a new sealing member 655b is disposed in the space from which the damaged sealing member 655a is removed as illustrated in FIG. 12C, the repaired double-sealing structure 650b may include the replaced sealing member 655b and the covering member 651 as illustrated in FIG. 12D.

As described above, in the present disclosure, when the sealing member needs to be replaced due to corrosion or etching, it is possible to only replace the sealing member while maintaining the bonding layer in the covered state. Accordingly, the apparatus maybe easily repaired, and the operating cost of the apparatus may be reduced.

According to the present disclosure as set forth above, in the electrostatic chuck device, it is possible to completely cover the bonding layer using the double-sealing structure, in which the covering member disposed on the periphery or around the bonding layer, by which the chuck body and the base plate are bonded, is bonded to the sealing member. Accordingly, it is possible to improve the durability and the efficiency of the operation of the electrostatic chuck device In particular, it is possible to prevent contaminants from being produced within the chamber due to the corrosion or etching of the bonding layer. It is also possible to overcome the problem in that a hot spot is formed in a location near the periphery of an electrostatic chuck and the possibility of contamination is increased along with the accumulation of the phenomenon in which the bonding layer is etched or decomposed little by little due to the processing gas, such as a plasma gas, infiltrating into the bonding layer.

Although the present disclosure has been described hereinabove with reference to the specific embodiments and the drawings, the description is for illustrative. Those skilled in the art will appreciate that various modifications are possible without departing from the scope of the technical idea of the present disclosure. In addition, the technical ideas described in the respective embodiments may be carried out not only independently but also in combinations. Therefore, the scope of protection of the present disclosure shall be defined by the language of the Claims and the equivalents thereof.

What is claimed is:

1. A substrate processing apparatus comprising:
a chuck body configured to attract and hold a substrate, wherein the chuck body includes a first lower surface, a second lower surface, and a third lower surface directly connecting the first lower surface to the second lower surface, and wherein the second lower surface is higher than the first lower surface;
a base plate located below the chuck body to support the chuck body;
a bonding layer disposed between the first lower surface of the chuck body and a first portion of an upper surface of the base plate and bonding the chuck body and the base plate with each other, wherein a side surface of the bonding layer and the third lower surface of the chuck body is vertically aligned with each other;
a sealing member provided around the side surface of the bonding layer to prevent the bonding layer from being damaged; and
a covering member entirely covering the side surface of the bonding layer to prevent a processing gas from infiltrating into the bonding layer,
wherein the covering member and the sealing member is disposed in a space defined by the side surface of the bonding layer, the second lower surface of the chuck body, a second portion of the upper surface of the base plate,
wherein a double-sealing structure of the covering member and the sealing member is provided,
wherein the sealing member and the covering member are made from different materials,
wherein the covering member comprises a thermal conductive additive,
wherein a thermal conductivity of the covering member with the thermal conductive additive has a value in a predetermined error range of a thermal conductivity of the bonding layer,
wherein the covering member comprises a thermosetting resin or a fluorine resin.

2. The substrate processing apparatus of claim 1, wherein the sealing member surrounds a side surface of the covering member.

3. The substrate processing apparatus of claim 1, wherein at least a portion of the sealing member extends along the side surface of the covering member, and wherein the covering member is horizontally disposed between the portion of the sealing member and the side surface of the bonding layer.

4. The substrate processing apparatus of claim 1, wherein the covering member and the sealing member completely fills the space.

5. The substrate processing apparatus of claim 1, wherein the sealing member has a circular or polygonal cross-section, and wherein the covering member is configured to correspond to the cross-section of the sealing member to surround at least a portion of the sealing member facing the bonding layer.

6. The substrate processing apparatus of claim 1, wherein the sealing member is detachably attached to the covering member.

7. A method of fabricating a substrate processing apparatus, the method comprising:
forming a bonding layer in a first space between a chuck body and a base plate to bond the chuck body and the base plate with each other, wherein the chuck body is configured to attract and hold a substrate and the base plate is located below the chuck body to support the chuck body; and
sealing the bonding layer by forming a covering member covering the bonding layer to prevent a processing gas from infiltrating into the bonding layer and a sealing member preventing the bonding layer from being damaged, thereby forming a double-sealing structure of the covering member and the sealing member,
wherein the sealing of the bonding layer comprises:
forming the covering member covering the bonding layer by injecting a covering material into a second space between the chuck body, the base plate, and a side surface of the bonding layer to coat at least a portion of the chuck body and the base plate defining the second space, followed by curing; and
forming the sealing member on peripheral portions of the covering member by inserting a sealing material into the second space,
wherein, in the forming of the covering member, the covering material is injected into the second space and is cured to fill a portion of the second space,
wherein in the forming of the sealing member, the sealing material is injected into a remaining portion of the second space,
wherein, in the injecting of the covering material, the covering material is coated on a top surface and a bottom surface of the second space,
wherein in the injecting of the sealing material, the sealing material is injected so that a top surface and a bottom surface of the sealing material contact the covering material, and
wherein in the curing of the covering material, the covering material is cured to form the covering member such that a portion between the chuck body, the base plate, and the sealing member is filled with the covering material.

8. The method of claim 7,
wherein, in the injecting of the covering material, the covering material is injected to partially fill the second space,
wherein in the injecting of the sealing material, at least a portion of the sealing material directed toward the bonding layer is injected into the covering material to completely fill the second space, and
wherein in the curing of the covering material, the covering material is cured to form the covering member covering the side surface of the bonding layer.

9. The method of claim 7,
wherein the covering member comprises a liquid thermosetting resin, and
wherein the sealing member comprises a solid fluorine resin.

10. The method of claim 9,
wherein the covering member further comprises a thermal conductive additive, a content of which is adjusted such that a thermal conductivity of the covering member is in a predetermined range of a thermal conductivity of the bonding layer.

11. The method of claim 7,
wherein the covering member comprises a liquid fluorine resin.

12. A substrate processing apparatus comprising:
a chuck body made from a dielectric substance and configured to attract and hold a substrate on a top surface thereof using electrostatic chucking force generated by coupling caused by a power source, wherein the chuck body includes a heater, by which a temperature of the substrate is adjusted, and an electrode buried in the chuck body;
a base plate located below the chuck body and supporting the chuck body, wherein the base plate includes a coolant passage;
a bonding layer bonding the chuck body and the base plate;
a covering member entirely covering a side surface of the bonding layer in a space between the chuck body and the base plate while surrounding the side surface of the bonding layer to prevent a processing gas from infiltrating into the bonding layer, wherein the chuck body includes a first horizontal lower surface, a second horizontal lower surface higher than the first horizontal lower surface, and a third vertical lower surface directly connecting the first horizontal lower surface to the second horizontal lower surface; and
a sealing member inserted into the space between a lower surface of the chuck body and an upper surface of the base plate and disposed around a side surface of the covering member to prevent the bonding layer from being damaged,
wherein a double-sealing structure of the covering member and the sealing member is provided,
wherein the sealing member and the covering member are made from different materials,
wherein the covering member comprises a thermal conductive additive, and
wherein a thermal conductivity of the covering member with the thermal conductive additive has a value in a predetermined error range of a thermal conductivity of the bonding layer.

* * * * *